US006967830B2

(12) United States Patent
Cooper et al.

(10) Patent No.: US 6,967,830 B2
(45) Date of Patent: Nov. 22, 2005

(54) EXPANSION MODULE AND NETWORK FOR AVIONIC DEVICES

(75) Inventors: Robert B. Cooper, Seattle, WA (US); Eugene E. Devereaux, Lakewood, WA (US); Sharon Y. Kaku, Auburn, WA (US)

(73) Assignee: The Boeing Company, Chicago, IL (US)

( * ) Notice: Subject to any disclaimer, the term of this patent is extended or adjusted under 35 U.S.C. 154(b) by 203 days.

(21) Appl. No.: 10/649,750

(22) Filed: Aug. 26, 2003

(65) Prior Publication Data

US 2005/0047065 A1 Mar. 3, 2005

(51) Int. Cl.[7] .............................................. H05K 5/00
(52) U.S. Cl. ...................... 361/679; 361/724; 455/431; 701/3; 701/10
(58) Field of Search .............................. 361/679, 685, 361/724–727; 455/431; 701/3, 10, 35, 36

(56) References Cited

U.S. PATENT DOCUMENTS

| 4,458,296 | A |   | 7/1984  | Bryant et al. |
| 5,778,203 | A | * | 7/1998  | Birkedahl et al. .......... 710/306 |
| 5,946,472 | A | * | 8/1999  | Graves et al. ................. 703/6 |
| 6,133,846 | A |   | 10/2000 | Birkedahl et al. |
| 6,286,060 | B1 | * | 9/2001 | DiGiorgio et al. ............ 710/31 |
| 6,394,815 | B1 |   | 5/2002 | Sarno et al. |
| 2003/0003872 | A1 |   | 1/2003 | Brinkley et al. |
| 2004/0230352 | A1 | * | 11/2004 | Monroe |

OTHER PUBLICATIONS

*Aircraft In-Flight Entertainment and Information Networks*; 11 pages; available at <http://www.informatics.ed.ac.uk/teaching/modules/cn/groupreports/airnets.pdf>.
WAEA Internet Working Group (IWG), On-Board Infrastructure AD HOC; *White Paper: On-Board Infrastructure, Version 1.0*; 2001; 18 pages; World Airline Entertainment Association; available at <http://www.waea.org/tech/techspecs//on-board_white_paper_v10.doc>.

* cited by examiner

Primary Examiner—Yean-Hsi Chang
(74) Attorney, Agent, or Firm—Alston & Bird LLP

(57) ABSTRACT

An apparatus and network, each including at least one expansion module, and an associated method are provided. The expansion module can be disposed between an aircraft connector and an avionic device connector to provide an electrical circuit for transmissions therebetween. The expansion module generates a signal representative of the transmissions, and the signal can be communicated, for example, via an Ethernet network to a controller, data storage device, or other devices. Further, the expansion module can be received by a tray that is also configured to receive the avionic device, so that the tray secures the avionic device to the aircraft, and the expansion module connects the avionic device and the aircraft when the avionic device is received by the tray. The expansion module can be disposed between corresponding aircraft connectors and avionic device connectors, such that the present invention can be used to retrofit existing aircraft.

35 Claims, 3 Drawing Sheets

EXPANSION MODULE AND NETWORK FOR AVIONIC DEVICES

BACKGROUND OF THE INVENTION

1) Field of the Invention

The present invention relates to the connection of electronic devices to an aircraft and, more particularly, relates to an apparatus for providing a connection for electrical transmissions between an aircraft and one or more electronic devices such that signals representative of the transmissions can be generated and communicated therefrom.

2) Description of Related Art

Conventional aircraft electronic systems include a number of electronic avionic devices, each of which is provided in a separate enclosure. Each device, which is typically referred to as a line replaceable unit (LRU), is secured to a tray that is connected to a shelf on the aircraft. For example, FIG. 1A illustrates a conventional tray 10 for securing a line replaceable unit (LRU) 12 on an aircraft. The tray 10 is typically secured to a shelf, which can hold multiple trays 10. Each tray 10 can correspond in size to the LRU 12 disposed thereon. An aircraft connector 14 at the back of the tray 10 connects the LRU 12 to the aircraft, e.g., to the aircraft wiring system. The aircraft connector 14 can be a single connection device or multiple connection devices. The aircraft connector 14 can be an ARINC-type connector, i.e., connectors that include a plurality of mating pin and socket terminals in accordance with specifications set forth by ARINC, Inc., such as ARINC Specification 600. A corresponding ARINC-type connector 16 can be provided on the LRU 12. The aircraft connector 14 can be secured to the tray 10 so that the connector 14 engages the LRU 12 when the LRU 12 is disposed in the tray 10. The LRU 12 can communicate by sending and/or receiving electrical signals through the connector 14 and, hence, the aircraft wiring system. Thus, the LRU can receive information, such as data from flight control devices, sensors, and the like. For example, one LRU receives data regarding the position, elevation, speed, and orientation of the aircraft via the aircraft wiring system from sensors or other devices on the aircraft. The LRU uses the data to generate display signals that control the devices in the cockpit to graphically display the data.

In some aircraft electronic systems, the information that is communicated to and from the LRUs is also transmitted to additional systems, such as a crew information system. The crew information system can be used for a variety of purposes, including tracking and scheduling maintenance operations, verifying the completion of flight procedures, recording or transmitting information for training, and the like. However, retrofitting aircraft to include such additional systems can be difficult and costly. For example, modification of the LRUs to include additional functionality can be prohibitively expensive and can require lengthy requalification and recertification procedures to verify the proper operation of the LRUs. Devices adapted to communicate with these additional systems can instead be housed separately from the existing LRUs, and Y-connectors can be disposed between the aircraft wiring system and the existing LRUs so that the electrical transmissions therebetween can be communicated to the devices adapted to communicate with the additional systems. However, such changes to the aircraft wiring system to accommodate the additional systems can be costly. Further, in some aircraft, there is limited space available for the addition of components. Even if sufficient space is available in the aircraft for the additional systems, the electrical cables required for connecting the additional systems to the aircraft wiring system can be prohibitively long and large. In some cases, the electrical connection of long wires to the connections between the aircraft wiring system and the LRUs can cause unacceptable interference with the electrical transmissions therebetween. Further, retrofitting requirements for individual aircraft can differ, requiring different connectors, different cables, different placement of additional devices, and the like. This complicates the retrofitting procedures and increases the cost.

Thus, there exists a need for an apparatus for connecting devices to an aircraft for communicating with additional systems, such as devices communicating with a crew information system. The apparatus should allow the connection of additional devices to a conventional arrangement of LRUs so that the devices can receive data communicated between the LRUs and the aircraft wiring system. In addition, the apparatus should preferably minimize or eliminate the need for additional requalification and recertification of the LRUs.

BRIEF SUMMARY OF THE INVENTION

The present invention provides an apparatus and network, each including at least one expansion module for communicating signals representative of electrical transmissions occurring between an aircraft and an avionic device. Each expansion module can be disposed between corresponding aircraft connectors and avionic device connectors, such that the present invention can be used to retrofit existing aircraft. The expansion modules can also be configured to generate signals representative of the electrical transmissions between the aircraft and the avionic devices without substantially modifying those transmissions.

According to one embodiment of the present invention, each expansion module includes first and second connectors having a plurality of electrical terminals configured to mechanically engage and electrically connect to the aircraft connector and the avionic device connector, respectively. The terminals can be pin and socket elements, such as are used in an ARINC-type connector. An electrical circuit, such as electrical paths on one or more printed circuit boards, defines a plurality of electrical junctions between the electrical terminals of the first and second connectors. The circuit is configured to communicate a signal representative of at least one of the electrical transmissions between the avionic device and the aircraft to a communication network, for example, via an Ethernet connection to an Ethernet communication network. The electrical circuit can be connected to a power source, although the expansion module can be configured to provide the electrical junctions for the electrical transmissions between the avionic device and the aircraft even when the electrical circuit is not powered.

According to another embodiment of the present invention, each expansion module is structured to be received by a tray that also receives the avionic device. The tray can secure the avionic device to the aircraft, and the expansion module connects the avionic device and the aircraft when the avionic device is received by the tray.

The present invention also provides a communication network for communicating signals representative of electrical transmissions occurring between a plurality of avionic devices and an aircraft. The network, which includes at least two of the expansion modules, can also include a controller that is configured to receive the signals transmitted by the expansion modules. The controller can also provide power to the circuits of the expansion connectors. In addition, the network can include a communication device for transmitting data from the communication network via a radio signal to a second aircraft, a satellite, or a ground-based receiver. A data storage device can also be provided for recording data from the network.

According to yet another embodiment, the present invention provides a method for retrofitting an aircraft having a plurality of avionic devices. An avionic device connector of each avionic device is disconnected from a respective aircraft connector, and an expansion module is disposed therebetween so that the expansion module connects the avionic device to the aircraft. Subsequently, an electrical transmission is delivered between the avionic device and the aircraft via the expansion module. The expansion module generates a signal representative of the electrical transmission and communicates the signal therefrom, for example, to a controller via an Ethernet network. The signal can be generated without substantially modifying the electrical transmissions between the avionic device and the aircraft. Further, the data can be stored in a data storage device or transmitted via a radio signal to a second aircraft, a satellite, or a ground-based receiver.

BRIEF DESCRIPTION OF THE SEVERAL VIEWS OF THE DRAWINGS

Figure 1:
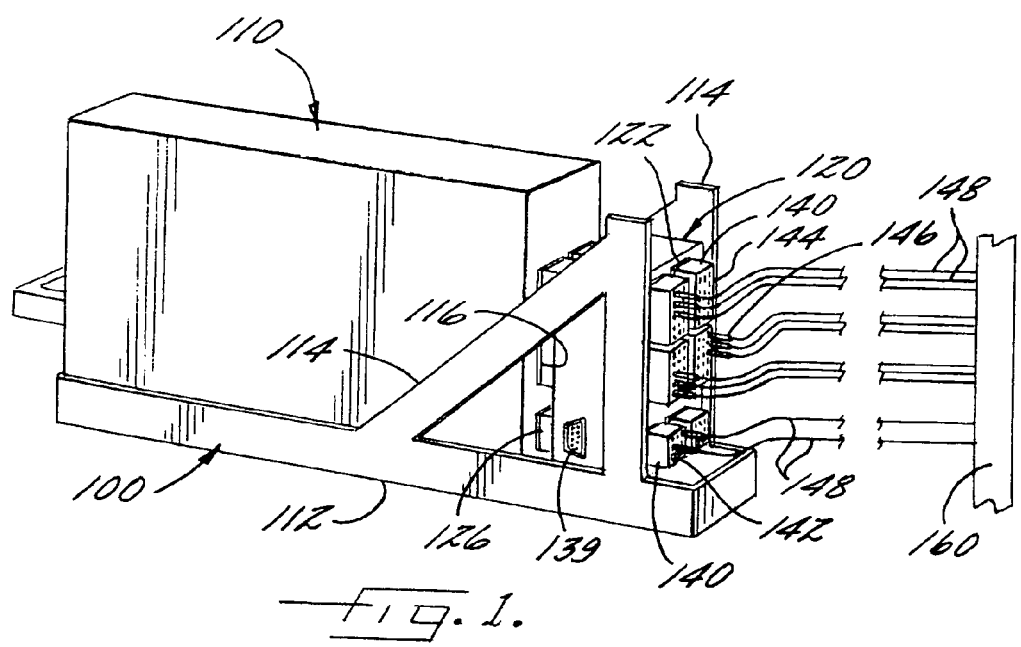
Figure 2:
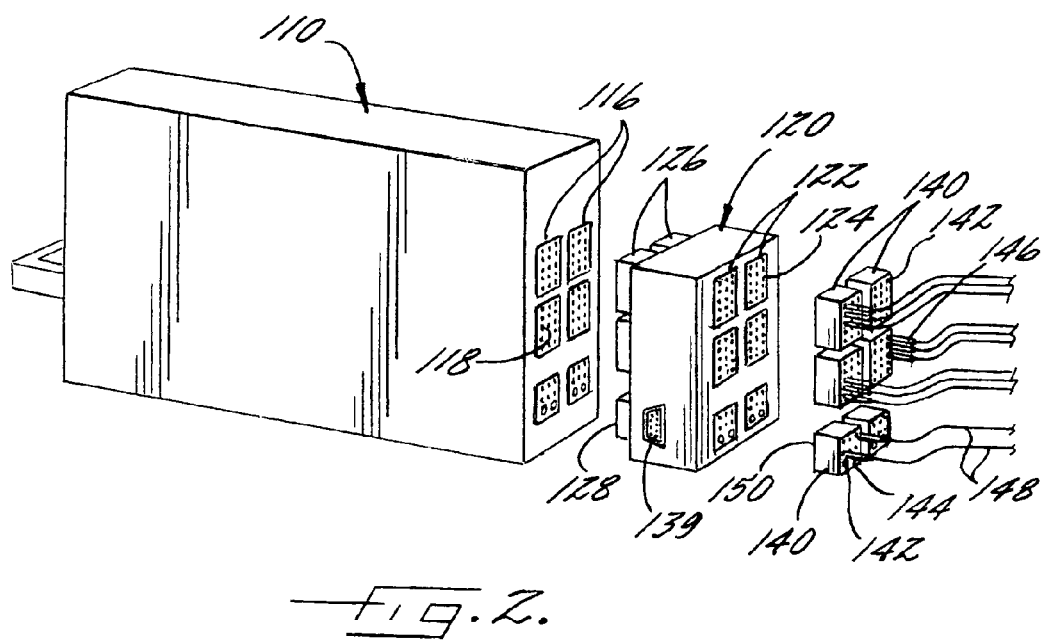
Figure 1A:
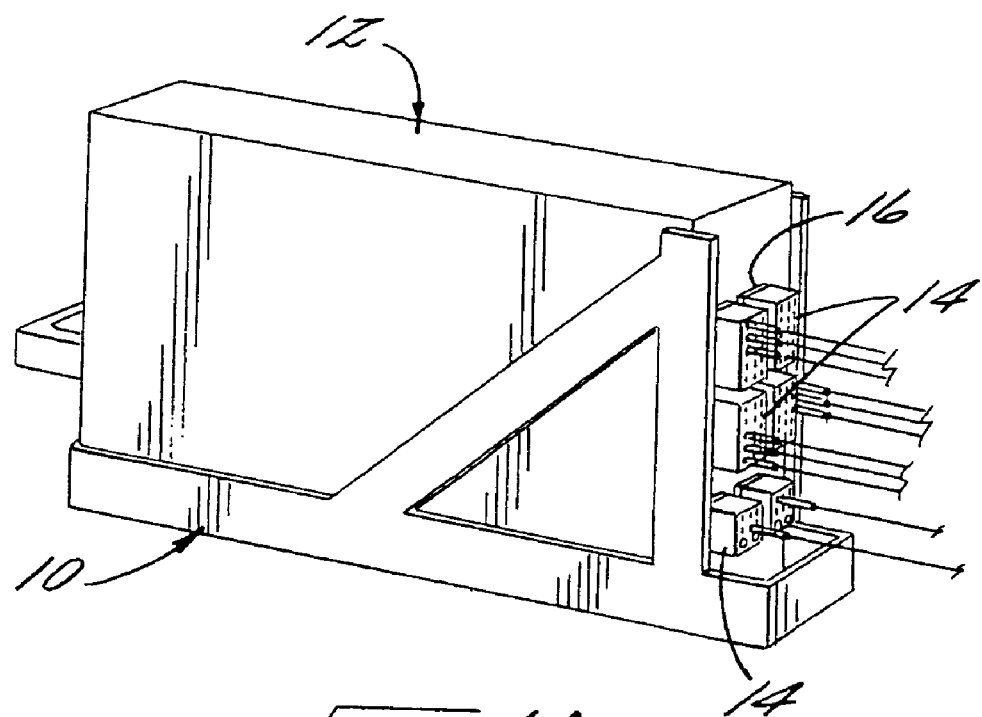
Figure 3:
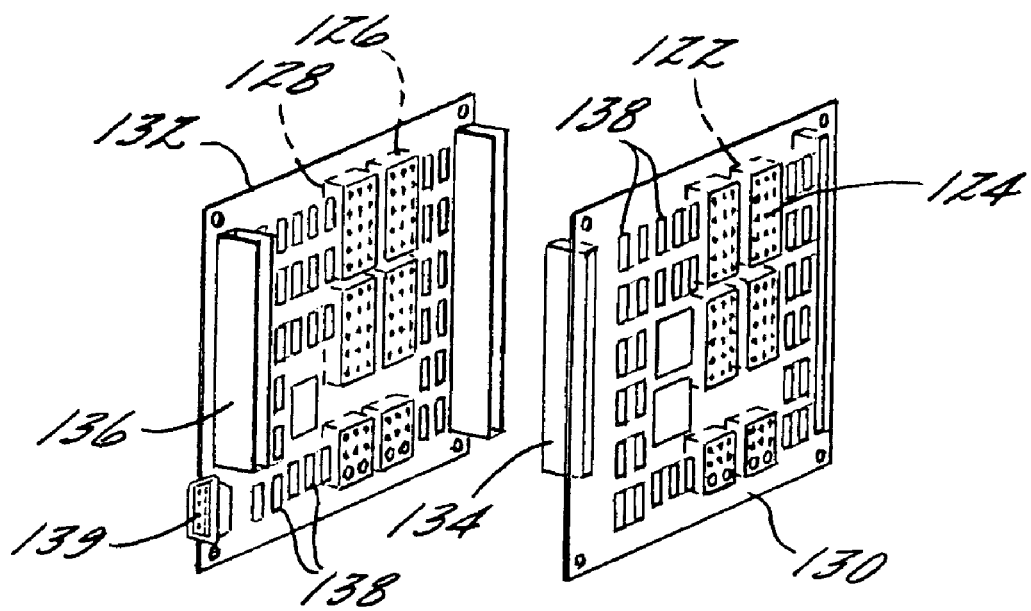
Figure 4:
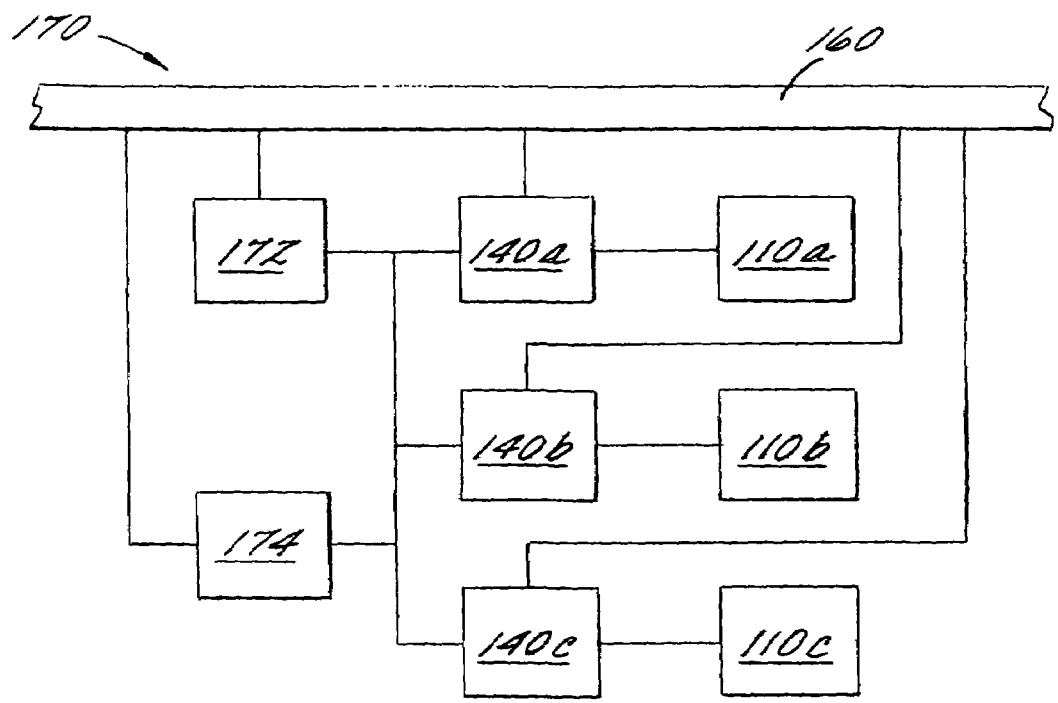
Figure 5:
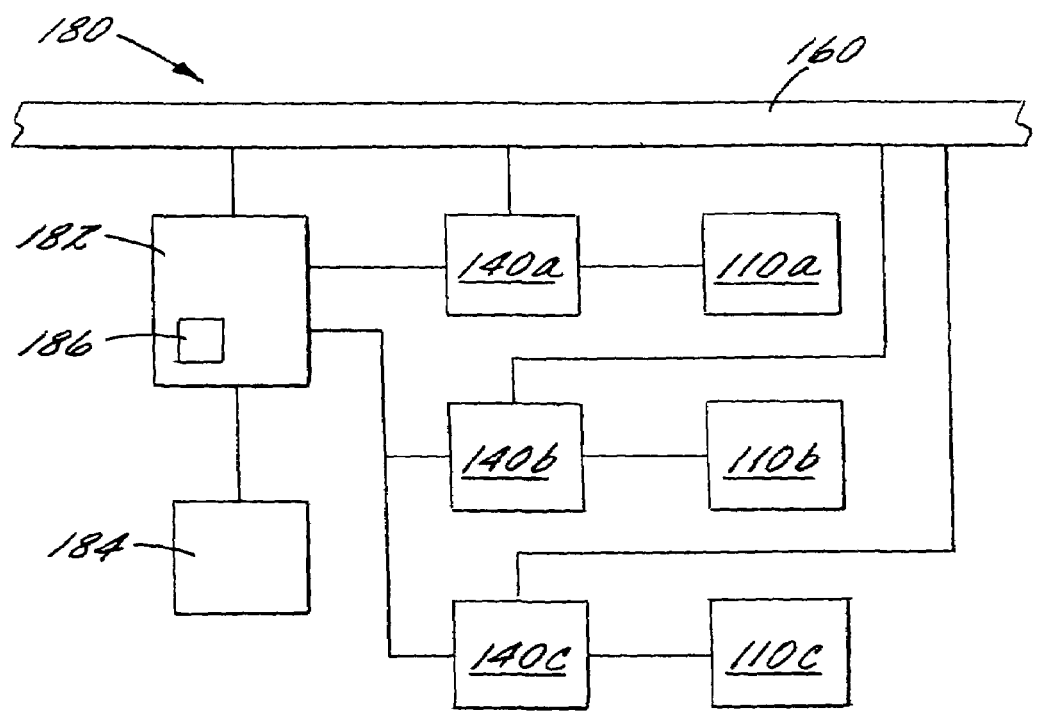

Having thus described the invention in general terms, reference will now be made to the accompanying drawings, which are not necessarily drawn to scale, and wherein:

FIG. 1 is a perspective view illustrating a tray with an expansion module according to one embodiment of the present invention;

FIG. 1A is a perspective view illustrating a conventional tray for connecting an LRU to an aircraft wiring system;

FIG. 2 is an exploded perspective view illustrating the expansion module of FIG. 1 with an avionic device and an aircraft connector;

FIG. 3 is an exploded perspective view illustrating the circuit boards of the expansion module of FIG. 1;

FIG. 4 is a schematic view illustrating a communication network according to one embodiment of the present invention; and FIG. 5 is a schematic view illustrating a communication network according to another embodiment of the present invention.

DETAILED DESCRIPTION OF THE INVENTION

The present invention now will be described more fully hereinafter with reference to the accompanying drawings, in which some, but not all embodiments of the invention are shown. Indeed, this invention may be embodied in many different forms and should not be construed as limited to the embodiments set forth herein; rather, these embodiments are provided so that this disclosure will satisfy applicable legal requirements. Like numbers refer to like elements throughout.

Referring now to the drawings, and in particular to FIG. 1, there is illustrated a tray 100 according to one embodiment of the present invention. The tray 100 can be connected to a shelf or other support member in an aircraft, and is structured to receive and support an avionic device 110 such as a line replaceable unit. An expansion module 120 is disposed between an aircraft connector 140 and the avionic device 110. The aircraft connector 140 can include one or more conventional connection devices. As shown in FIG. 1, the tray 100 includes a bottom 112 and sides 114 that correspond in size to the avionic device 110 and the expansion module 120. Thus, the trays 100 of the present invention can be generally longer than conventional trays for securing a particular avionic device 110 so that the tray 100 also accommodates the expansion module 120.

The aircraft connector 140 shown in FIG. 1 is an ARINC-type connector and, in particular, a connector that conforms to the ARINC 600 specification. In particular, the aircraft connector 140 defines a plurality of sockets 142 on a first side 144. Each socket 142 is structured to receive a crimped pin 146 that is connected to one of a plurality of electrical wires 148 extending to the aircraft, e.g., to an aircraft wiring system 160 disposed throughout the aircraft. The expansion module 120, shown disconnected from the avionic device 110 in FIG. 2, also defines first and second connectors 122, 126. The first connector 122 is configured to connect to a second side 150 of the aircraft connector 140. The second connector 126 is configured to connect to an avionic device connector 116 on the avionic device 110. Thus, the expansion module 120 connects the avionic device 110 to the aircraft so that the avionic device 110 can communicate through the expansion module 120 with other devices of the aircraft.

The first connector 122 can include a plurality of electrical terminals 124 that mechanically engage and thereby electrically connect to the aircraft connector 140. Similarly, the second connector 126 can include a plurality of electrical terminals 128 that mechanically engage and thereby electrically connect to the avionic device connector 116. In particular, as shown in FIG. 2, the terminals 124 of the first connector 122 can include a plurality of female socket elements that are configured to receive pins of the aircraft connector 140, and the second connector 126 can include a plurality of male pin elements configured to be received by female sockets 118 of the avionic device connector 116. Further, the electrical terminals 128 of the second connector 126 can correspond to the electrical terminals 124 of the first connector 122 in size and arrangement so that the expansion module 120 can be disposed between corresponding avionic device and aircraft connectors 116, 140, i.e., an avionic device connector 116 and aircraft connector 140 that are configured to be engaged directly. Thus, the expansion module 120 can be fitted to a conventional avionic device and aircraft connector, for example, to retrofit an aircraft for the purpose of adding a communication network, by disposing the expansion module 120 between the aircraft and respective avionic devices 110 and replacing the conventional trays with trays 100 structured to receive the avionic device 110 and the expansion module 120.

The expansion module 120 includes an electrical circuit that defines a plurality of electrical junctions, or paths, between the electrical terminals 124, 128 of the first and second connectors 122, 126. For example, each junction can extend between one or more than one of the electrical terminals 124 of the first connector 122 and a corresponding one or more of the terminals 128 of the second connector 126. Preferably, the junctions are defined by at least one circuit board in the expansion module 120. As shown in FIG. 3, the first and second connectors 122, 126 are mounted on first and second circuit boards 130, 132, respectively, and the two circuit boards 130, 132 are connected by interboard connectors 134, 136, which are also mounted on the respective circuit boards 130, 132. The interboard connectors 134, 136 electrically connect the junctions between the connectors 130, 132, which are defined by electrical paths disposed on the boards 130, 132, as is known in the art. Thus, each junction can extend from a terminal 124 of the first connector 122, through the first board 130, the first and second interboard connectors 134, 136, the second board 132, and the second connector 126. In other embodiments, the junctions can be defined by one or other numbers of circuit boards, or the junctions can be defined by other electrical components such as wires.

As described above, the expansion module 120 is structured to communicate electrical transmissions between the avionic device 110 and the aircraft wiring system 160. In addition, the expansion module 120 communicates a signal representative of at least one of those electrical transmissions to a communication network. For example, as illustrated in FIG. 3, the boards 130, 132 include convention electrical components 138 such as integrated circuits, transistors, capacitors, resistors, diodes, and the like for generating and communicating signals that are representative of the electrical transmissions between the avionic device 110 and the aircraft wiring system 160.

The expansion module 120 also includes a port 139 through which the module 120 can receive power and can communicate. For example, the port 139 can include an Ethernet connection, and the expansion module 120 can be configured to communicate via the port 139 to a network that includes other avionic devices or otherwise, as further described below in connection with FIGS. 4 and 5. Electrical power can also be received through the port 139 for powering the expansion module 120.

FIG. 4 schematically illustrates a communication network 170 according to one embodiment of the present invention for communicating data from a plurality of the avionic devices 110, designated by reference numerals 110a, 110b, 110c. Each of the avionic devices 110a, 110b, 110c is connected to the aircraft wiring system 160 via a respective one of the expansion modules 140, designated by reference numerals 140a, 140b, 140c. Each of the expansion modules 140a, 140b, 140c is connected to a power supply 172, e.g., through the ports 139 of the modules 140, to receive power from the aircraft. Although three avionic devices 110a, 110b, 110c and three expansion modules 140a, 140b, 140c are shown in FIG. 4, any number of avionic devices 110 and expansion modules can be included in the network 170. The expansion modules 140a, 140b, 140c are also interconnected via the ports 139, which can provide Ethernet connections, though other network connections can alternatively be used in other embodiments of the present invention. Further, one or more additional devices 174 can be connected to the communication network 170. The additional device 174 can be a computer or other electronic processing device that is configured to receive signals from the expansion modules 140a, 140b, 140c and store, process, or transmit information based thereon. For example, the additional device 174 can be an onboard computer or an LRU that has radio transmission capabilities. Thus, the additional device 174 can store data received from the expansion modules 140a, 140b, 140c and/or transmit the data, e.g., to a ground-based receiver, satellite, or other aircraft.

FIG. 5 schematically illustrates a communication network 180 according to another embodiment of the present invention. Similar to the network 170 illustrated in FIG. 4, the network 180 includes a plurality of avionic devices 110a, 110b, 110c and expansion modules 140a, 140b, 140c. In addition, the expansion modules 140a, 140b, 140c are connected to a controller 182. The controller 182 is configured to supply power from the aircraft to the expansion modules 140a, 140b, 140c, though in other embodiments the expansion modules 140a, 140b, 140c can alternatively be connected to other power supplies. The controller 182 also communicates with the expansion modules 140a, 140b, 140c, i.e., sends information to and/or receives information from the expansion modules 140a, 140b, 140c, e.g., via Ethernet connections therebetween. The controller 182 can communicate with a communication device 184, such as a radio transmitter, that is configured to transmit information based on the signals from the expansion modules 140a, 140b, 140c. In addition, the controller 182 can include a data storage device 186, such as a disk drive, optical data recording device, flash memory device, or the like, such that the controller 182 can transmit some of all of the data received from the expansion modules 140a, 140b, 140c for storing in the data storage device 186.

Preferably, each expansion module 140 provides the electrical junctions between the aircraft and the corresponding avionic device 110 so that electrical transmissions therebetween occur without substantial interference or modification by the expansion module 140. For example, each expansion module 140 can be configured to provide the electrical junctions even if the power supply 172 and/or the controller 182 are disconnected from the expansion module 140. Further, when powered, the expansion module 140 can monitor the electrical transmissions without substantially reducing the voltage or current of the transmissions.

Each expansion module 140 provides signals that are representative of the electrical transmissions that occur between the aircraft wiring system 160 and the respective avionic device 110. For example, the expansion module 140 can monitor each of the electrical junctions and generate signals that are reproductions of the electrical transmissions. Preferably, the expansion module 140 adapts the data communicated by the electrical transmissions to form a signal that can be communicated over a network, such as the networks 170, 180 shown in FIGS. 4 and 5. For example, the expansion module 140 can digitize the signals and communicate the data in packets according to a conventional Ethernet protocol. Thus, the plurality of expansion modules 140 can generate signals that are representative of the electrical transmissions and communicate the signals over a common network to the controller 182, additional device 174, other expansion modules 140, and the like.

The networks 170, 180 according to the present invention can be used for a variety of functions on an aircraft. For example, the signals can be used to communicate data relating to the operation of the aircraft according to the electrical transmissions between the avionic devices 110 and the other devices on the aircraft. Such data can include information regarding the position, elevation, speed, and orientation of the aircraft. The data can also relate to the maintenance of the aircraft, the operation or position of the aircraft's control devices, the status of sensors, the display of information in the cockpit or cabin, and the like. This information can be stored and/or relayed throughout a crew information system (CIS). The CIS can also use the information for a variety of purposes. For example, the CIS can record and track maintenance operations, provide maintenance information to the aircraft crew or maintenance personnel, track flight operations and provide operational data to the crew, tracking personnel, and the like. In particular, the CIS can notify the crew if flight operations are not performed or are performed incorrectly or untimely. The data also can be used for accident investigation, simulation, and the like. For example, the controller 82 can relay the information to the communication device for transmission to a ground-based receiver. The ground-based receiver can compile flight information for use in computer-based flight simulation. For example, the receiver can correlate the operation of the aircraft, adjustment of controls by the crew, weather conditions, aircraft characteristics, and the like to provide detailed simulation scenarios for computer-based flight simulation programs for training.

Many modifications and other embodiments of the invention set forth herein will come to mind to one skilled in the art to which these inventions pertain having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. An expansion module configured to be disposed between an avionic device connector of an avionic device and a corresponding aircraft connector of an aircraft for providing a plurality of electrical junctions between the avionic device and the aircraft for electrical transmissions therebetween and communicating a signal representative of at least one of the electrical transmissions therefrom to a communication network, the expansion module comprising:
a first connector having a plurality of electrical terminals configured to mechanically engage and thereby electrically connect to the aircraft connector;
a second connector having a plurality of electrical terminals configured to mechanically engage and thereby electrically connect to the avionic device connector, wherein the avionic device connector is configured to engage the aircraft connector; and
an electrical circuit defining a plurality of electrical junctions between the electrical terminals of the first and second connectors for connecting the aircraft connector and the avionic device, the circuit configured to transmit the electrical transmissions between the avionic device and the aircraft without substantially modifying the transmissions and generate and communicate a signal representative of at least one of the electrical transmissions between the avionic device and the aircraft to the communication network.

2. An expansion module according to claim 1 wherein the electrical terminals of the second connector are structured to correspond to the electrical terminals of the first connector such that the expansion module is configured to be disposed between the corresponding avionic device connector and aircraft connector.

3. An expansion module according to claim 1 wherein the electrical terminals of the first and second connectors are ARINC-type connection elements configured to connect to ARINC-type connection elements of the avionic device and aircraft connectors.

4. An expansion module according to claim 1 wherein the electrical circuit is configured to communicate the signal over an Ethernet connection to an Ethernet communication network.

5. An expansion module according to claim 1 wherein the terminals of the first connector are female socket elements configured to receive male pin elements of the aircraft connector, and the terminals of the second connector are male pin elements configured to be received by female socket elements of the avionic device connector.

6. An expansion module according to claim 1 further comprising at least one printed circuit board defining the electrical circuit, wherein the first and second connectors are mounted on the at least one circuit board.

7. An expansion module according to claim 1 wherein the electrical circuit is configured to connect to a power source and the expansion module is configured to provide the electrical junctions for the electrical transmissions between the avionic device and the aircraft when the electrical circuit is not powered.

8. An apparatus for receiving an avionic device on an aircraft and providing a plurality of electrical junctions between an avionic device connector of the avionic device and an aircraft connector of the aircraft for electrical transmissions therebetween, the apparatus comprising:
a tray configured to receive the avionic device and secure the avionic device to the aircraft; and
an expansion module structured to be received by the tray, the expansion module comprising:
a first connector directed in a first direction having a plurality of electrical terminals configured to mechanically engage and thereby electrically connect to the aircraft connector;
a second connector directed in a second direction opposite the first direction having a plurality of electrical terminals configured to mechanically engage and thereby electrically connect to the avionic device connector when the avionic device is received by the tray, the avionic device connector being configured to engage the aircraft connector before the expansion module is disposed therebetween; and
an electrical circuit defining a plurality of electrical junctions between the electrical terminals of the first and second connectors for connecting the aircraft connector and the avionic device, the circuit configured to communicate a signal representative of at least one of the electrical transmissions between the avionic device and the aircraft to the communication network,
wherein the expansion module is received by the tray such tat the connectors are disposed between the avionic device connector and the aircraft connector and the expansion module connects the avionic device and the aircraft when the avionic device is received by the tray and thereby secured to the aircraft.

9. An apparatus according to claim 8 wherein the electrical terminals of the second connector are structured to correspond to the electrical terminals of the first connector such that the expansion module is configured to be disposed between the corresponding avionic device connector and aircraft connector.

10. An apparatus according to claim 8 wherein the electrical terminals of the first and second connectors are ARINC-type connection elements configured to connect to ARINC-type connection elements of the avionic device connector and aircraft connector.

11. An apparatus according to claim 8 wherein the electrical circuit is configured to communicate the signal over an Ethernet connection to an Ethernet communication network.

12. An apparatus according to claim 8 wherein the terminals of the first connector are female socket elements configured to receive male pin elements of the aircraft connector, and the terminals of the second connector are male pin elements configured to be received by female socket elements of the avionic device connector.

13. An apparatus according to claim 8 further comprising at least one printed circuit board defining the electrical circuit, wherein the first and second connectors are mounted on the at least one circuit board.

14. An apparatus according to claim 8 wherein the electrical circuit is configured to connect to a power source and the apparatus is configured to provide the electrical junctions for the electrical transmissions between the avionic device and the aircraft when the electrical circuit is not powered.

15. An apparatus according to claim 8 wherein the expansion module is configured to transmit the electrical transmissions between the avionic device and the aircraft without substantially modifying the transmissions.

16. An apparatus according to claim 8 wherein the first connector is structured to releasably engage the aircraft connector and the second connector is structured to releasably engage the avionic device such that the avionic device can be readily removed from the tray for retrofitting the aircraft.

17. A communication network for communicating signals representative of electrical transmissions occurring between a plurality of avionic devices, each having an avionic device connector, and an aircraft having a plurality of aircraft connectors, each aircraft connector corresponding to a respective one of the avionic devices, the communication network comprising:
    at least two expansion modules configured for communicating with the network, each expansion module comprising:
        a first connector having a plurality of electrical terminals configured to mechanically engage and thereby electrically connect to a respective one of the aircraft connectors;
        a second connector having a plurality of electrical terminals configured to mechanically engage and thereby electrically connect to a respective one of the avionic device connectors, wherein the avionic device connector is configured to engage the aircraft connector; and
        an electrical circuit defining a plurality of electrical junctions between the electrical terminals of the first and second connectors for connecting the aircraft connector and the avionic device, the circuit configured to transmit the electrical transmissions between the avionic device and the aircraft without substantially modifying the transmissions and generate and transmit a signal to the network, the signal being representative of at least one of the electrical transmissions between the avionic device and the aircraft.

18. A communication network according to claim 17 further comprising a controller in electrical communication with each of the expansion modules, the controller being configured to receive the signals transmitted by the expansion modules.

19. A communication network according to claim 18 wherein the controller provides power to the circuits of the expansion connectors.

20. A communication network according to claim 17 further comprising a communication device configured to transmit data from the communication network from the aircraft via a radio signal to at least one of a second aircraft, a satellite, and a ground-based receiver.

21. A communication network according to claim 17 further comprising a data storage device for recording data from the network, the data storage device being in communication with the expansion modules.

22. A communication network according to claim 17 wherein the electrical terminals of each second connector are structured to correspond to the electrical terminals of a respective first connector such that each expansion module is configured to be disposed between one of the corresponding avionic device connectors and a corresponding one of the aircraft connectors.

23. A communication network according to claim 17 wherein the electrical terminals of the first and second connectors are ARINC-type connection elements configured to connect to ARINC-type connection elements of the avionic device connectors and aircraft connectors.

24. A communication network according to claim 17 wherein the electrical circuit of each expansion module is configured to communicate the signals over Ethernet connections.

25. A communication network according to claim 17 wherein the terminals of each first connector are female socket elements configured to receive male pin elements of a respective aircraft connector, and the terminals of each second connector are male pin elements configured to be received by female socket elements of a respective avionic device connector.

26. A communication network according to claim 17 wherein each expansion module includes at least one printed circuit board defining the electrical circuit, and the first and second connectors are mounted on the at least one circuit board.

27. A communication network according to claim 17 wherein the electrical circuit of each expansion module is configured to connect to a power source, and each expansion module is configured to provide the electrical junctions for the electrical transmissions when the electrical circuit is not powered.

28. A communication network according to claim 17 wherein the expansion modules are configured to transmit the electrical transmissions between the avionic devices and the aircraft without substantially modifying the transmissions.

29. A method for retrofitting an aircraft having a plurality of avionic devices with avionic device connectors connected to aircraft connectors of the aircraft, the method comprising:
    disconnecting an avionic device connector of a first avionic device from a respective aircraft connector;
    disposing an expansion module between the avionic device connector and the aircraft connector such that the expansion module connects the avionic device to the aircraft;
    delivering an electrical transmission between the avionic device and the aircraft via the expansion module;
    generating a signal representative of the electrical transmission in the expansion module;
    communicating the signal from the expansion module.

30. A method according to claim 29 further comprising receiving the signal in a controller.

31. A method according to claim 29 further comprising storing data characteristic of the signal in a data storage device.

32. A method according to claim 29 further comprising transmitting data characteristic of the signal via a radio signal to at least one of a second aircraft and a ground-based receiver.

33. A method according to claim 29 wherein said communication step comprises communicating the signal via an Ethernet network.

34. A method according to claim 29 wherein said generating and communicating steps comprises generating and communicating the signal without substantially modifying the electrical transmission between the avionic device and the aircraft.

35. A method according to claim 29 further comprising repeating the disconnecting and disposing steps such that a plurality of expansion modules are disposed between the aircraft and respective avionic devices.

* * * * *